United States Patent
Ko et al.

(10) Patent No.: US 12,283,479 B2
(45) Date of Patent: Apr. 22, 2025

(54) SUBSTRATE PROCESSING METHOD

(71) Applicant: ASM IP Holding B.V., Almere (NL)

(72) Inventors: JaeOk Ko, Seoul (KR); HeeSung Kang, Anyang-si (KR); JaeBin Ahn, Suwon-si (KR); SeokJae Oh, Suwon-si (KR); WanGyu Lim, Hwaseong-si (KR); HyounMo Choi, Hwaseong-si (KR); YoungJae Kim, Cheonan-si (KR); Shinya Ueda, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 357 days.

(21) Appl. No.: 17/847,531

(22) Filed: Jun. 23, 2022

(65) Prior Publication Data
US 2022/0415650 A1    Dec. 29, 2022

Related U.S. Application Data

(60) Provisional application No. 63/215,965, filed on Jun. 28, 2021.

(51) Int. Cl.
| | |
|---|---|
| H01L 21/02 | (2006.01) |
| C23C 16/02 | (2006.01) |
| C23C 16/04 | (2006.01) |
| C23C 16/34 | (2006.01) |
| C23C 16/455 | (2006.01) |
| C23C 16/505 | (2006.01) |
| H01J 37/32 | (2006.01) |
| H01L 21/311 | (2006.01) |
| H01L 21/768 | (2006.01) |

(52) U.S. Cl.
CPC .... *H01L 21/02274* (2013.01); *C23C 16/0236* (2013.01); *C23C 16/045* (2013.01); *C23C 16/345* (2013.01); *C23C 16/45534* (2013.01); *C23C 16/45536* (2013.01); *C23C 16/4554* (2013.01); *C23C 16/45553* (2013.01); *C23C 16/505* (2013.01); *H01J 37/3244* (2013.01); *H01L 21/0217* (2013.01); *H01L 21/02211* (2013.01); *H01L 21/0228* (2013.01); *H01L 21/31116* (2013.01); *H01L 21/76877* (2013.01)

(58) Field of Classification Search
None
See application file for complete search history.

(56) References Cited

U.S. PATENT DOCUMENTS

2017/0053811 A1*  2/2017  Fung ............... C23C 16/045

\* cited by examiner

*Primary Examiner* — Jiong-Ping Lu
(74) *Attorney, Agent, or Firm* — Snell & Wilmer L.L.P.

(57) ABSTRACT

Provided is a substrate processing method capable of filling a film in a gap structure without forming voids or seams in a gap, the substrate processing method including: a first step of forming a thin film on a structure including a gap by performing a first cycle including supplying a first reaction gas and supplying a second reaction gas to the structure a plurality of times; a second step of etching a portion of the thin film by supplying a fluorine-containing gas onto the thin film; a third step of supplying a hydrogen-containing gas onto the thin film; a fourth step of supplying an inhibiting gas to an upper portion of the gap; and a fifth step of forming a thin film by performing a second cycle including supplying the first reaction gas and supplying a second reaction gas onto the thin film a plurality of times.

20 Claims, 12 Drawing Sheets

SUBSTRATE PROCESSING METHOD

CROSS-REFERENCE TO RELATED APPLICATIONS

This application claims priority to U.S. Provisional Patent Application Ser. No. 63/215,965 filed Jun. 28, 2021, titled SUBSTRATE PROCESSING METHOD, the disclosure of which is hereby incorporated by reference in its entirety.

BACKGROUND

1. Field

One or more embodiments relate to a substrate processing method, and more particularly, to a substrate processing method of filling a gap formed in a structure on a substrate. In more detail, one or more embodiments relate to a substrate processing method of filling a film in a gap structure in a recess area formed on a substrate.

2. Description of the Related Art

As the integration of semiconductor devices continues, the difficulty of a process of filling a gap structure having a high aspect ratio is also increasing. When a method of simply filling the gap by a deposition process is used, there are limitations such as voids being formed inside the gap. Accordingly, as an alternative, a deposition-etch-deposition (DED) method has been used. This DED method uses a nitrogen trifluoride ($NF_3$) gas as an etching gas to periodically etch a film formed in an inlet area of an upper portion of a gap, so that an inlet of the upper portion of the gap may be kept open during a gap fill process. However, when this method is used, fluorine (F) remains in the film, and a film formation rate, film quality, and device performance decrease.

In order to solve the problems of the DED method, a deposition-etch-$H_2$ plasma treatment-deposition (DEHD) method in which a fluorine gas is removed in the form of hydrogen fluoride (HF) by subjecting a film formed on a gap structure to hydrogen plasma treatment after etching using the $NF_3$ gas has been proposed. However, hydrogen acts as hydrogen-terminated sites to promote deposition at a film surface, thereby increasing a film deposition rate in an upper area of a gap. Accordingly, there is a problem in that the upper area of the gap is closed first, so that a void is formed inside the gap.

SUMMARY

One or more embodiments include filling a gap without voids while removing a fluorine (F) component that may remain in a film during a gap fill process.

One or more embodiments include providing a more efficient gap filling method by filling a gap without voids and at the same time increasing a gap filling rate.

Additional aspects will be set forth in part in the description which follows and, in part, will be apparent from the description, or may be learned by practice of the presented embodiments of the disclosure.

According to one or more embodiments, a substrate processing method includes: a first step of forming a thin film on a structure including a gap by performing a first cycle including supplying a first reaction gas onto the structure and supplying a second reaction gas a plurality of times; a second step of etching a portion of the thin film by supplying a fluorine-containing gas onto the thin film; a third step of supplying a hydrogen-containing gas onto the thin film; a fourth step of supplying an inhibiting gas to an upper portion of the gap; and a fifth step of forming a thin film by performing a second cycle including supplying the first reaction gas and supplying a second reaction gas on the thin film a plurality of times.

According to an example of the substrate processing method, during the second step, an etch rate of a thin film on the upper portion of the gap may be greater than an etch rate of a thin film on a lower portion of the gap.

According to an example of the substrate processing method, the hydrogen-containing gas supplied during the third step may remove fluorine-terminated sites formed on a surface of the thin film by the second step.

According to a further example of the substrate processing method, the hydrogen-containing gas supplied during the third step may reach the lower portion of the gap.

According to an example of the substrate processing method, the inhibiting gas supplied during the fourth step may remove the hydrogen-terminated sites on the thin film that are bonding to the first or second reaction gas.

According to a further example of the substrate processing method, the inhibiting gas supplied during the fourth step removes the hydrogen-terminated sites on the thin film in the upper portion of the gap, thereby suppressing the formation of a thin film on the upper portion of the gap during the fifth step.

According to a further example of the substrate processing method, the inhibiting gas may include a nitrogen-containing gas, and after the fourth step, nitrogen-terminated sites may exist on the thin film in the upper portion of the gap and hydrogen-terminated sites may exist on the thin film in the lower portion of the gap.

According to a further example of the substrate processing method, the second to fifth steps may be repeatedly performed until the gap is filled.

According to a further example of the substrate processing method, during filling of the gap, a width of an inlet at the upper portion of the gap may be maintained to be greater than a width of the lower portion of the gap.

According to an example of the substrate processing method, a supply time of the inhibiting gas may be less than a supply time of the first reaction gas, the second reaction gas, the fluorine-containing gas, and the hydrogen-containing gas.

According to an example of the substrate processing method, RF power is supplied during the first step to the fifth step, and the intensity of the RF power supplied during the second step is less than the intensity of the RF power supplied during the first step, the third step, and the fourth step.

According to an example of the substrate processing method, RF power is supplied during the first step to the fifth step, and a RF frequency supplied during the second step is less than a RF frequency supplied during the first step, the third step, and the fourth step.

According to one or more embodiments, a substrate processing method includes: a first step of forming a thin film on a structure including a gap by performing a first cycle including supplying a first reaction gas onto the structure, supplying a second reaction gas, supplying RF power, and purging a residue a plurality of times; a second step of etching a portion of the thin film by performing a second cycle including supplying an etching gas on the thin film, supplying RF power, and purging a residue a plurality of times; a third step of forming a reaction promoting layer on the thin film to promote bonding of the first reaction gas or the second reaction gas by performing a third cycle including supplying a film formation promoting gas on the thin film, supplying RF power, and purging a residue a plurality of times; a fourth step of forming a passivation layer on a thin film in an upper portion of the gap by performing a fourth cycle including supplying an inhibiting gas to the upper portion of the gap, supplying RF power, and purging a residue a plurality of times; and a fifth step of forming an additional thin film by performing a fifth cycle including supplying a first reaction gas onto the thin film, supplying a second reaction gas, supplying RF power, and purging a residue a plurality of times.

According to an example of the substrate processing method, the RF power supplied in the third cycle may be high frequency-high power, and may be supplied longer than a supply time of the RF power supplied in the first cycle, the second cycle, the fourth cycle, and the fifth cycle, so that the film formation promoting gas may reach a lower portion of the gap.

According to an example of the substrate processing method, the RF power supplied in the fourth cycle may be high frequency power and a supply time thereof may be shorter than the RF power supplied in the first cycle to the third cycle, and the fifth cycle.

According to one or more embodiments, a substrate processing method includes: a first step of forming a thin film on a structure including a gap; a second step of supplying a fluorine-containing gas onto the thin film to etch a portion of the thin film, wherein an etch rate of a thin film in an upper portion of the gap is greater than an etch rate of a thin film in a lower portion of the gap; a third step of supplying a hydrogen-containing gas onto the thin film to remove fluorine-terminated sites formed on a surface of the thin film formed at the second step; a fourth step of supplying a nitrogen-containing gas onto the thin film to remove a portion of the hydrogen-terminated sites formed on the surface of the thin film at the third step; and a fifth step of depositing an additional thin film on the thin film on which the second to fourth steps have been performed.

According to an example of the substrate processing method, the hydrogen-containing gas supplied during the third step reaches the lower portion of the gap to form hydrogen-terminated sites on a surface of the thin film in the lower portion of the gap, and the hydrogen-terminated sites formed on the surface of the thin film in the lower portion of the gap may serve as a reaction promoting layer that promotes bonding of a reaction gas supplied during the fifth step.

According to a further example of the substrate processing method, the fourth step may include supplying a nitrogen-containing gas onto the upper portion of the gap to remove hydrogen-terminated sites formed on a surface of the thin film in the upper portion of the gap.

According to a further example of the substrate processing method, the nitrogen-containing gas supplied during the fourth step may form nitrogen-terminated sites on the surface of the thin film in the upper portion of the gap, and the nitrogen-terminated sites formed on the surface of the thin film in the upper portion of the gap may serve as an inhibiting layer that inhibits bonding of the reaction gas supplied during the fifth step.

According to an example of the substrate processing method, during the fifth step, a thin film deposition rate at the upper portion of the gap may be slower than a thin film deposition rate at the lower portion of the gap.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
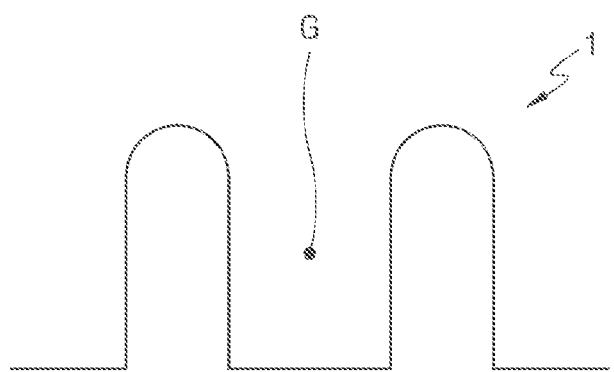
FIGS. 1 to 6 are cross-sectional views illustrating a substrate processing method according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments will be described more fully with reference to the accompanying drawings.

In this regard, the present embodiments may have different forms and should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

In the disclosure, "gas" may include evaporated solids and/or liquids and may include a single gas or a mixture of gases. In the disclosure, a process gas supplied to a reaction space may include a precursor gas and an additive gas. The precursor gas and the additive gas may typically be introduced as a mixed gas or may be separately introduced into a reaction space. The precursor gas may be introduced together with a carrier gas such as an inert gas. The additive gas may include a dilution gas such as a reactive gas and an inert gas. The reactive gas and the dilution gas may be mixed or separately introduced into the reaction space. The precursor may include two or more precursors, and the reactive gas may include two or more reactive gases. In some embodiments, the term "film" may refer to a layer that extends continuously in a direction perpendicular to a thickness direction without substantially having pinholes to cover an entire target or a relevant surface, or may refer to a layer that simply covers a target or a relevant surface. The film may include a discrete single film or layer or multiple films or layers having some characteristics, and the boundary between adjacent films or layers may be clear or unclear and may be set based on physical, chemical, and/or some other characteristics, formation processes or sequences, and/or serves or purposes of the adjacent films or layers.

Hereinafter, embodiments of the disclosure will be described with reference to the accompanying drawings. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

FIGS. 1 to 6 are cross-sectional views illustrating a substrate processing method according to embodiments.

Referring to FIG. 1, a structure 1 including a gap G is provided on a substrate (not shown).

In general, when the gap G is filled with nitrides (or oxides) by a plasma process (e.g., PEALD), nitride walls are formed as the nitrides are deposited on both sidewalls of the gap G, and as a thickness of the nitride walls increases, a width between the nitride walls decreases. As a physical distance (the width) between the nitride walls decreases, it becomes increasingly difficult for a reaction gas to flow into a lower portion of the gap G, and as deposition is concentrated in an upper area of the gap G, voids or seams are left inside the gap G and between the nitride walls. These voids cause defects in a metal film patterning process. Accordingly, the disclosure attempts to fill a gap by a deposition-etch $H_2$ plasma treatment-$N_2$ plasma treatment-deposition (DEHND) method, as will be described later with reference to FIGS. 2 to 6.

Figure 2:
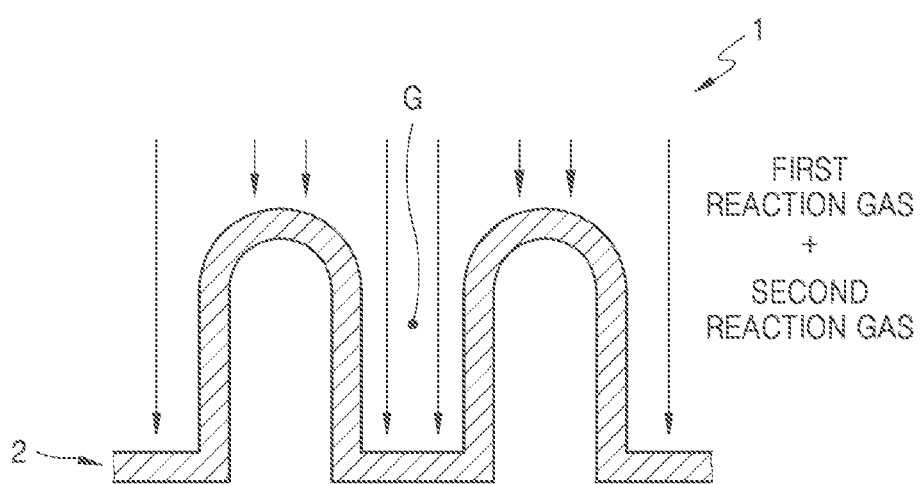

Referring to FIG. 2, a thin film 2 is formed on the structure 1 including the gap G. The thin film 2 may be formed on the structure 1 by performing a cycle including supplying a first reaction gas onto the structure 100 including the gap G and supplying a second reaction gas a plurality of times. The first reaction gas and the second reaction gas may be supplied alternately and sequentially. The cycle may be repeated one or more times, and as the cycle is repeated, the thickness of the thin film 2 may increase.

The first reaction gas may include a silicon-containing source gas. For example, the first reaction gas may be an aminosilane-based silicon-containing source gas including an alkyl group, for example, a methyl group ($-C_nH_{2n+1}$) or an ethyl group ($-C_nH_{2n+2}$).

The second reaction gas may include a nitrogen-containing gas. For example, the second reaction gas may be at least one of $N_2$, $NH_3$, $N_2O$, or $NO_2$, or a mixture of one or more thereof.

When the first reaction gas is a silicon-containing source gas and the second reaction gas is a nitrogen-containing gas, the thin film 2 may be a silicon nitride film (SiN).

Figure 10:
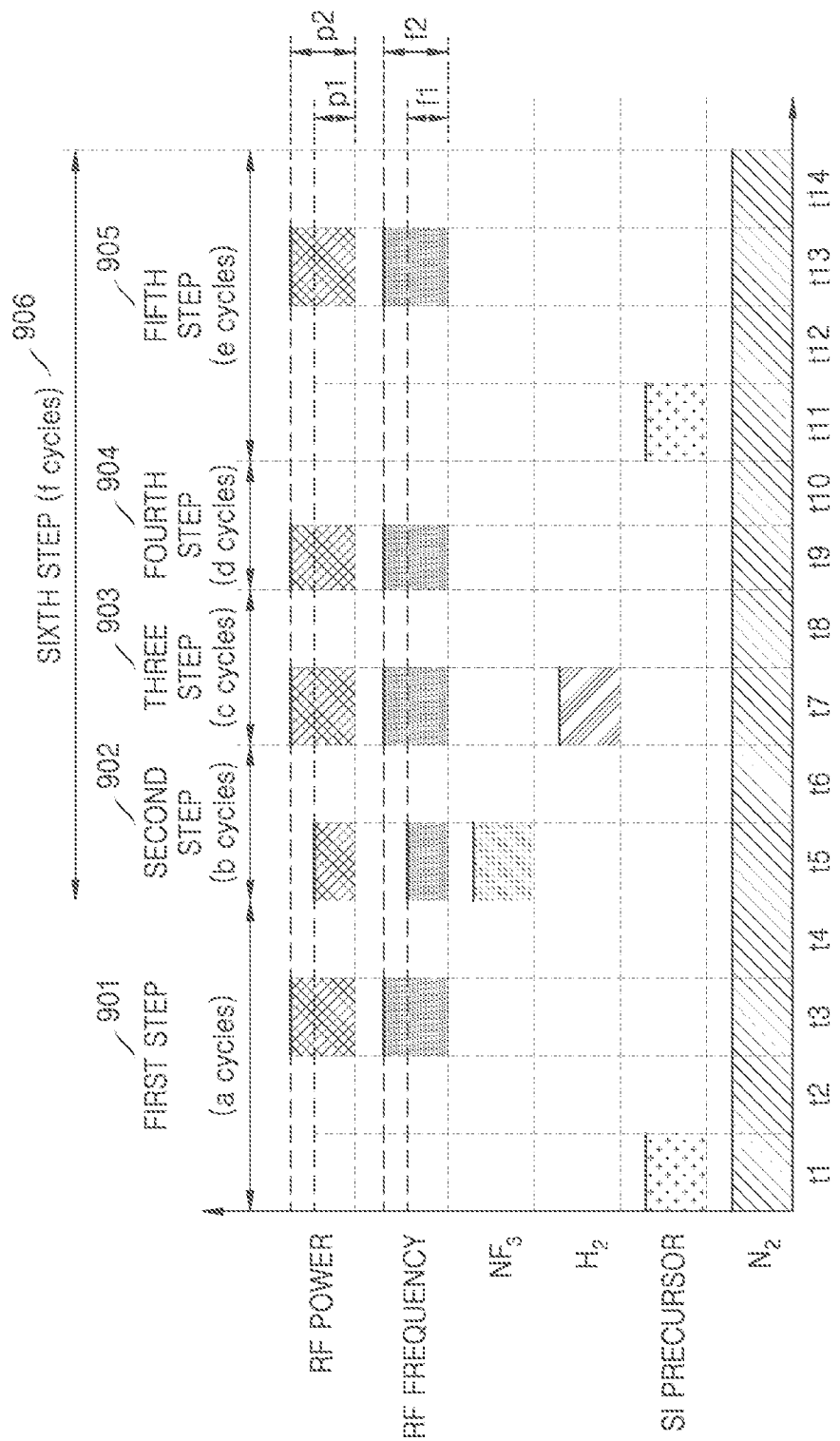
FIG. 10 is a view illustrating a substrate processing method according to embodiments.

In some embodiments, RF power may be supplied during at least part of a cycle for forming the thin film 2 (see FIG. 10). The thin film 2 may be adsorbed on the structure 1 by activating the second reaction gas by the RF power to induce a reaction between the first reaction gas and the second reaction gas. For example, the thin film 2 may be formed by PEALD.

At least one of the intensity of RF power, a RF frequency, a process pressure, and a reaction gas supply time may be adjusted such that the first reaction gas and the second reaction gas reach the lower portion of the gap G to form the thin film 2 up to a lower area of the gap G.

Figure 3:
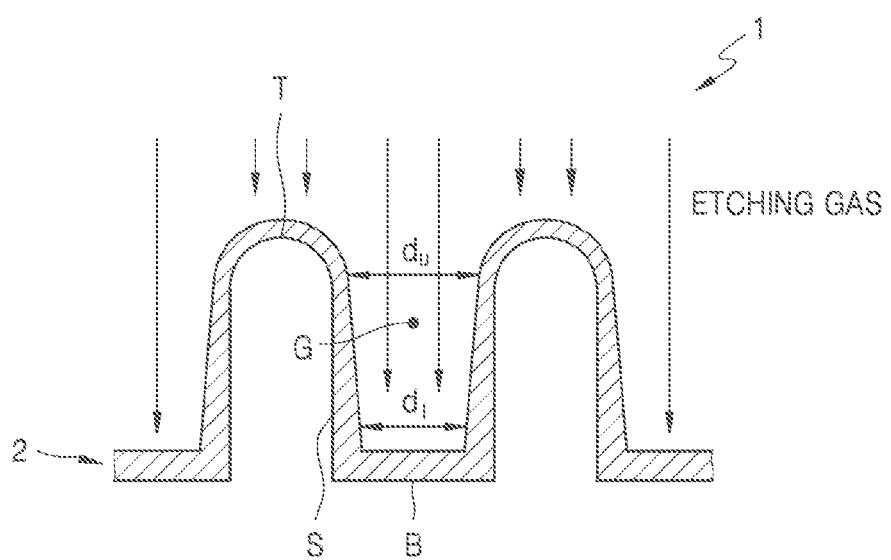

Referring to FIG. 3, a portion of the thin film 2 may be etched by supplying an etching gas onto the thin film 2 deposited on the structure 1 in FIG. 2.

In some embodiments, during the etching of a portion of the thin film 2, RF power may be supplied (see FIG. 10). The etching gas may be activated by the RF power to etch a portion of the thin film 2. In some embodiments, at least one of the intensity of the RF power, a RF frequency, a process pressure, and a reaction gas supply time may be adjusted in order for the etching gas to reach only an upper portion of the gap G, etch a portion of the thin film 2 on the upper portion of the gap G and maintain the thin film 2 on the lower portion of the gap G without etching. In other embodiments, at least one of the intensity of the RF power, a RF frequency, a process pressure, and a reaction gas supply time may be adjusted in order for the etching gas to reach the lower portion of the gap G and etch a portion of the thin film 2 on the lower portion as well as the upper portion of the gap G. In the latter case, due to the straightness of plasma active species (ions), an etch rate of the thin film 2 on the top surface T and the bottom surface B of the gap structure 1 in a direction perpendicular to a traveling direction of active species including an etching gas component will be greater than an etch rate of the thin film 2 on a side surface S of the gap structure 1 in a direction parallel to the traveling direction of the active species. In addition, the thin film 2 in an upper area of the gap structure 1 is directly exposed to the plasma active species and has a high etch rate, whereas an etch rate of the thin film 2 in a lower area of the gap structure 1 (e.g., the thin film 2 on the bottom surface B) may be relatively lower than an etch rate in the upper area of the gap structure 1 due to a shielding effect caused by a surrounding structure (e.g., the sidewall S of the gap structure 1) and due to the extinction of active species due to a relatively long migration distance of the active species. Accordingly, after the etching step, a profile of the thin film on the gap structure 1 may form a "V" or "U" shape as shown in FIG. 3. That is, a width $d_u$ of an inlet at the upper portion of the gap G may be greater than a width di of the lower portion of the gap G ($d_u > d_l$). This may prevent the upper area of the gap G from being first closed when filling a gap, thereby preventing voids from being formed inside the gap G.

The etching gas may include a fluorine-containing gas, for example, nitrogen trifluoride ($NF_3$). The fluorine-containing gas may be activated in-situ or by remotely supplied RF power, and a portion of a thin film (e.g., a SiN thin film) may be etched by an activated fluorine (F) component. In an actual experiment, it is confirmed that $NF_3$ is stably activated at low frequency (e.g., 430 kHz) and low power (e.g., 300 watt) RF power and at low process pressure (e.g., 3 Torr). In general, under plasma of low frequency and low power and low process pressure, a mean free path (MFP) of active species is relatively long in spite of the low density of the active species. Accordingly, a fluorine component activated under the plasma of low frequency and low power and the low process pressure may reach the bottom surface B of the gap G. However, as described above, in the case of the thin film 2 on the lower portion or the bottom surface B of the gap structure 1, due to the shielding effect due to the surrounding structure, and the reduction and extinction of the momentum of the active species due to the long migration distance of the plasma active species, the etch rate may be less than that of the thin film 2 on the upper portion of the gap structure 1. Therefore, the shape of the thin film on the gap structure 1 may still form a "V" or "U" shape.

Figure 7:
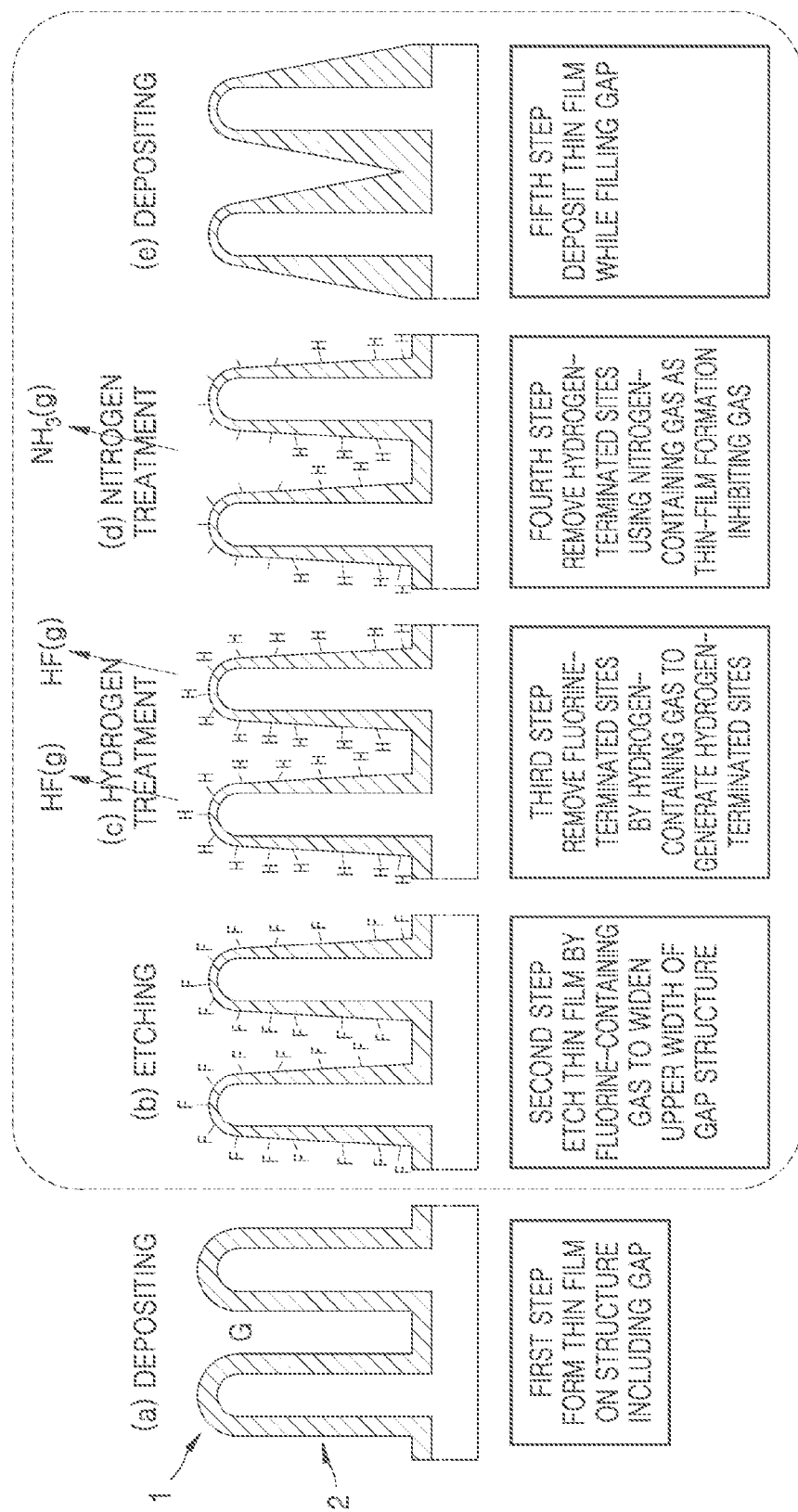
FIG. 7 is a cross-sectional view illustrating a substrate processing method according to embodiments.

In addition, in the etching step, fluorine-active species may etch the thin film and adsorb a portion of fluorine-active species to a surface of the thin film to form fluorine-terminated sites (see FIG. 7 (b)). These fluorine-terminated sites serve as an inhibiting layer during a subsequent gap fill process (an F incubation effect). As described above, because the fluorine active species reach the lower area of the gap structure 1 due to low frequency and low power plasma and low process pressure conditions, the inhibiting layer (i.e., the fluorine-terminated sites) may be uniformly formed on the lower area and the bottom surface B in addition to the upper area of the gap structure 1 (see FIG. 7 (b)).

Accordingly, this etching step has a technical effect of widening the width $d_u$ of the upper area of the gap structure 1 by supplying an etching gas (specifically, a fluorine gas), and at the same time has a problem in that an inhibiting layer is also formed in the lower portion of the gap structure 1.

Figure 4:
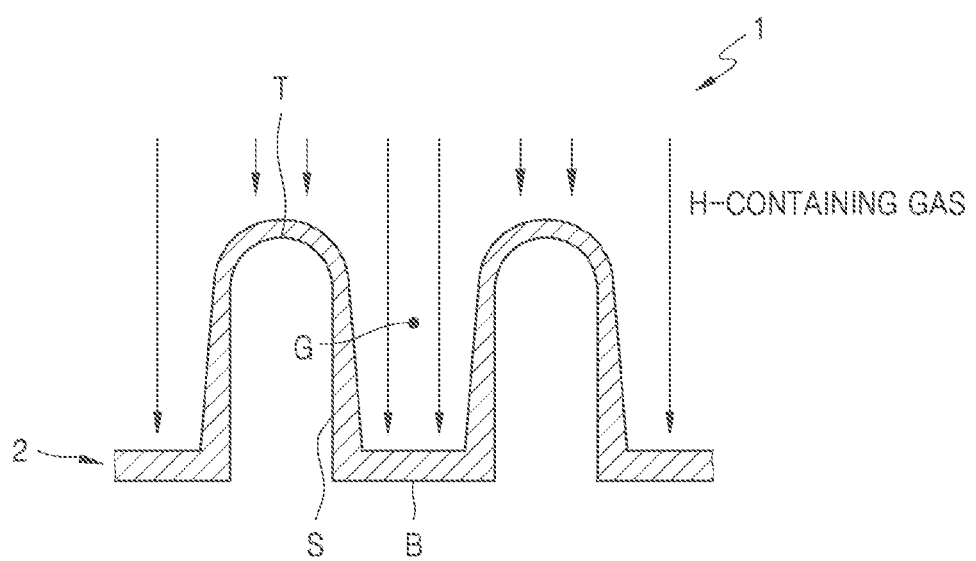

In order to solve this problem, that is, to remove the inhibiting layer formed in the step of FIG. 3, FIG. 4 shows a step of supplying a film formation promoting gas.

The film formation promoting gas may remove the inhibiting layer formed in the step of FIG. 3, and may form a reaction promoting layer that promotes bonding of the first reaction gas and/or the second reaction gas on the thin film 2.

In some embodiments, during the step of removing the inhibiting layer on the thin film 2, RF power may be supplied. The film formation promoting gas may be activated by the RF power to remove the inhibiting layer.

For a void-free gap fill process, the reaction promoting layer is preferably formed up to the lower portion of the gap G. In other words, it is preferable that the film formation promoting gas reaches the lower portion of the gap G. To this end, at least one of the intensity of the RF power, a RF frequency, a process pressure, and a supply time of a film formation promoting gas may be adjusted.

The film formation promoting gas may include a hydrogen-containing gas, for example, a hydrogen gas ($H_2$). Hydrogen active species activated by the RF power (e.g., hydrogen radicals or hydrogen ions) may generate a hydrogen fluoride gas (gaseous HF) through a chemical reaction with a fluorine-inhibiting layer to remove fluorine, which is an etching residue. That is, fluorine-terminated sites may be removed.

In an actual experiment, stable hydrogen plasma was formed when the hydrogen gas ($H_2$) was supplied together with high frequency RF power, high RF power (e.g., 700 watt) and high process pressure (e.g., 15 Torr). Due to the high frequency and high process pressure, a MFP (Mean Free Path) of the hydrogen active species is shortened. However, when a hydrogen-containing gas supply time increases, by a high ion density due to high RF power and a relatively long supply time (e.g., 40 seconds), the hydrogen active species may reach the lower portion and the bottom portion B of the gap structure 1, and a fluorine layer formed in the lower area of the gap structure 1 may be removed.

In addition, in a hydrogen-containing gas supply step, the hydrogen active species may remove a fluorine layer through a chemical reaction with fluorine-terminated sites, and some of the hydrogen active species replace the fluorine-terminated sites on a thin film surface to form hydrogen-terminated sites (see FIG. 7 (c)). In general, because a Si source gas reacts with hydrogen-terminated sites on a surface of a lower structure to form a —Si—N— (or —Si—O—) bond and deposit the same, when hydrogen-terminated sites are formed on the thin film 2, these hydrogen-terminated sites may promote bonding of Si source molecules during a subsequent gap fill process. Thus, these hydrogen-terminated sites may serve as the reaction promoting layer during the subsequent gap fill process. As described above, because the hydrogen active species reach the lower area of the gap structure 1 due to the high RF power and the relatively long supply time, the deposition promoting layer (i.e., hydrogen terminated sites) may be uniformly formed on the lower area and the bottom surface B in addition to the upper area of the gap structure 1 (see FIG. 7 (c)).

Therefore, by supplying a film formation promoting gas (e.g., a hydrogen-containing gas) to remove an inhibiting layer formed in the gap structure 1, particularly the lower portion of the gap structure 1, and forming a reaction promoting layer, this step has a technical effect of forming a thin film in the form of a bottom-up gap fill from the lower area toward the upper area of the gap G during a subsequent gap fill process.

In addition, this step has a technical effect of removing etch gas impurities (e.g., fluorine impurities) that may remain in a gap structure of a semiconductor device when the inside of the gap structure is filled using a deposition-etch-deposition (DED) method.

In addition, this step has a technical effect of forming stable hydrogen plasma by supplying a hydrogen-containing gas and a nitrogen gas together for a long time and forming a reaction promoting layer by supplying hydrogen active species to the lower portion and the bottom surface of the gap structure at the same time under high-frequency RF power and high process pressure.

However, when this step is used, a reaction promoting layer is generated not only on the lower portion and the bottom of the gap structure but also on the upper area of the gap structure, so a problem that a thin film is deposited more on the upper area of the gap G may occur during a subsequent gap fill process.

Figure 5:
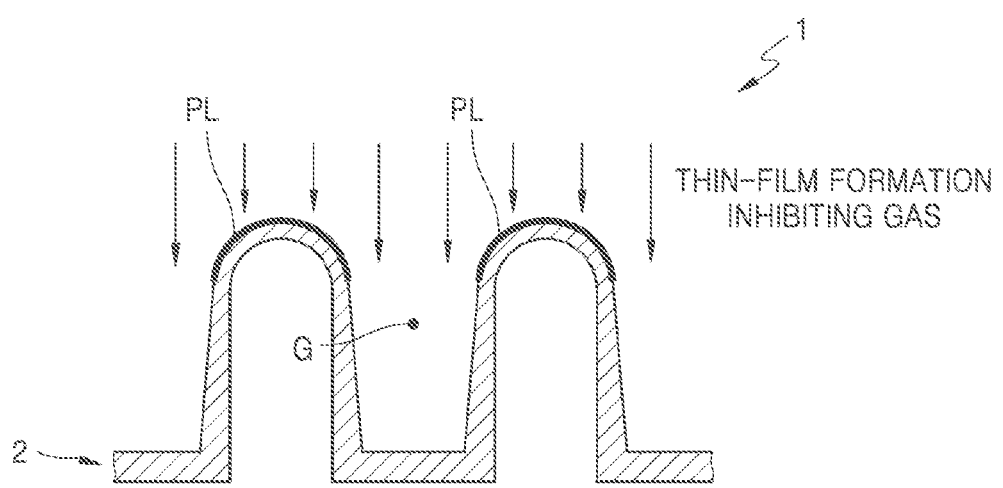

In FIG. 5, a step of forming a passivation layer PL by supplying an inhibiting gas on the thin film 2 formed in the gap G may be performed.

The passivation layer PL may be formed on the thin film 2 to remove the reaction promoting layer on a surface of the thin film 2 that bonds to a first reaction gas and/or a second reaction gas. For example, hydrogen-terminated sites on the thin film 2 that may bond to the first reaction gas may be removed. Therefore, when the gap G is subsequently filled using the first reaction gas, the thin film 2 on which the passivation layer PL is formed will not bond to the first reaction gas, and the first reaction gas will not be adsorbed thereon.

The passivation layer PL is preferably formed on the thin film 2 on the upper portion of the gap G as indicated by a thick line in FIG. 5 to remove the reaction promoting layer thereon. Because, when the gap 5 is filled as described above, a filling gas (in this case, the first reaction gas and the second reaction gas) may be concentrated on the upper portion of the gap G. Thus, when the passivation layer PL is formed in the upper portion of the gap G, this upper concentration phenomenon may be removed. In other words, the passivation layer PL formed on the upper portion of the gap G may prevent a phenomenon in which the first reaction gas and the second reaction gas are deposited more on the upper portion than the lower portion of the gap G to close the gap G.

In some embodiments, in order to activate the inhibiting gas, RF power may be supplied during a period of supplying the inhibiting gas. In particular, in order to form a passivation layer on the upper portion of the gap G, plasma may be supplied with high-frequency power. At this time, the inhibiting gas may be supplied under high-frequency power to reach an upper area of the gap G. Because the ion density of an activated inhibiting gas increases under the high-frequency power and a MFP of the ions is shortened, an area to which the inhibiting gas reaches may be limited to the upper area of the gap G, and it is possible to minimize the amount of the inhibiting gas reaching a lower area of the gap G.

The inhibiting gas may include a nitrogen-containing gas, for example, nitrogen gas ($N_2$). Nitrogen active species activated by RF power (e.g., nitrogen radicals or nitrogen ions) may remove the reaction promoting layer (e.g., hydrogen-terminated sites) on the thin film 2 that bonds to the first or second reaction gas. Preferably, the nitrogen active species may selectively remove the hydrogen-terminated sites on the thin film 2 in the upper portion of the gap G, thereby suppressing the formation of a thin film on the upper portion of the gap G during a subsequent gap filling step. In more detail, the nitrogen active species may chemically react with the hydrogen-terminated sites and form an ammonia gas (gaseous $NH_3$) and remove the hydrogen-terminated sites.

In addition, in an inhibiting gas supply step, the nitrogen-active species may remove the reaction promoting layer by chemically reacting with the hydrogen-terminated sites, and a portion thereof may replace the hydrogen-terminated sites on the thin film surface to form nitrogen-terminated sites (see FIG. 7 (d)). These nitrogen-terminated sites may serve as an inhibiting layer that prevents adsorption of the first reaction gas and/or the second reaction gas (e.g., silicon (Si) source molecules) during a subsequent gap fill process. As described above, because the MFP of the ions is shortened due to high-frequency RF power, an area to which the nitrogen active species reach may be limited to the upper area of the gap G, and the inhibiting layer (i.e., nitrogen-terminated sites) may be uniformly formed on the upper area of the gap structure 1 (see FIG. 7 (d)).

In an actual experiment, nitrogen plasma is supplied for a short time (e.g., 2 seconds) under RF power of high frequency (e.g., 13.56 MHz) and high RF power (e.g., 700 W) and high process pressure (e.g., 15 Torr). Due to a high frequency, high process pressure conditions, and a short supply time, a MFP of the nitrogen active species is shortened, and therefore most of the nitrogen active species are distributed in the upper area of the gap structure 1. Therefore, after performing the step of FIG. 5, the hydrogen-terminated sites are removed and nitrogen-terminated sites are formed on the thin film 2 in the upper area of the gap, and hydrogen-terminated sites remain on the film 2 in the lower area of the gap.

Accordingly, the step of FIG. 5 has a technical effect of forming a thin film from the lower area to the upper area of the gap during a subsequent gap fill process by removing the reaction promoting layer in the upper area of the gap in the gap structure in which reaction promoting layers (e.g., hydrogen-terminated sites) are uniformly formed by the step of FIG. 4 and forming an inhibiting layer, while maintaining the reaction promoting layer in the lower portion of the gap. In other words, due to the inhibiting layer (i.e., passivation layer) formed in the upper area of the gap, the problem that a first reaction gas and a second reaction gas are deposited more on the upper portion than the lower portion of the gap and the upper portion is first closed may be prevented in the subsequent gap fill step.

Figure 6:
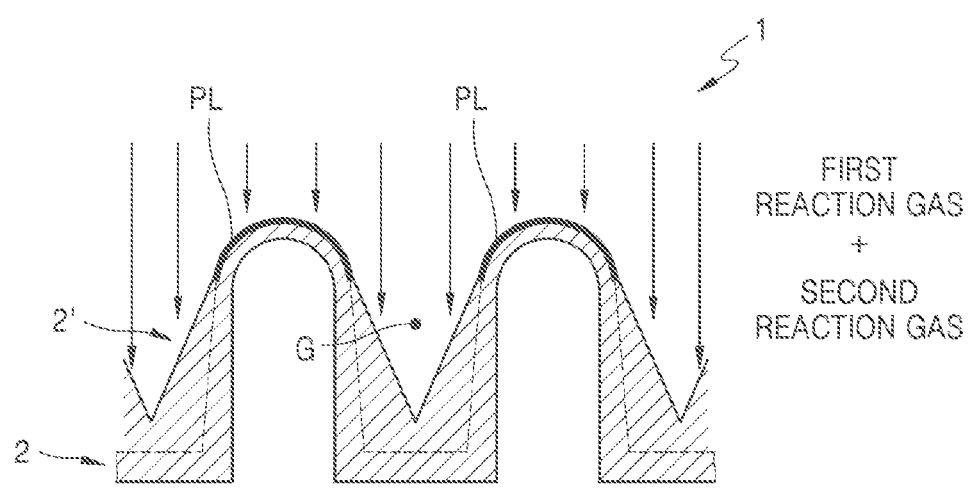

FIG. 6 shows a step of forming an additional thin film 2' on the thin film 2 to fill the gap G. For example, the additional thin film 2' may be formed by performing a cycle including a step of supplying the first reaction gas and a step of supplying the second reaction gas on the thin film 2 a plurality of times. The first reaction gas and the second reaction gas may be supplied alternately and sequentially. The cycle may be repeated one or more times, and as the cycle is repeated, the thickness of the thin film 2 may increase. Because the same reaction gas (i.e., the first reaction gas and the second reaction gas) is used, the thin film 2 and the additional thin film 2' may include the same component. For example, the thin film 2 and the additional thin film 2' may be a silicon nitride film (SiN).

At least one of the intensity of the RF power, a RF frequency, a process pressure, and a reaction gas supply time may be adjusted such that the first reaction gas and the second reaction gas reach the lower portion of the gap G to form the thin film 2' up to the lower area of the gap G.

When the first reaction gas and the second reaction gas are supplied in FIG. 6, the passivation layer PL is formed on the thin film 2 in the upper portion of the gap G by the step of FIG. 5. The passivation layer PL may remove the reaction promoting layer (e.g., hydrogen-terminated sites) on the thin film 2 bonding to the first reaction gas, thereby suppressing the formation of an additional thin film on the thin film 2 in the upper portion of the gap G. As described above, when the gap G is filled, a filling gas (e.g., the first reaction gas) may be concentrated on the upper portion of the gap G, and because the passivation layer PL has removed the reaction promoting layer on the thin film 2, the adsorption of the first reaction gas is suppressed on the thin film 2 in the upper portion of the gap G. In addition, as described above, the first reaction gas and/or the second reaction gas may reach the lower portion of the gap G. Accordingly, as shown in FIG. 6, the additional thin film 2' may be deposited thicker in the lower portion than the upper portion of the gap G.

As such, due to the etching step by the etching gas and the passivation layer PL formed in the upper portion of the gap G, a width of an inlet at the upper portion of the gap G may be maintained greater than a width of the lower portion of the gap G during the gap fill process of FIG. 6, thereby preventing a phenomenon that the upper area of the gap G is first closed. Therefore, according to the present method, the gap G may be filled without the formation of voids or seams.

In some embodiments, after performing the steps of FIGS. 2 to 5 for a gap structure, the gap may be filled by the step of FIG. 6. However, in other embodiments, a group cycle of repeating the steps of FIGS. 2 to 6 at least twice may be repeated until the gap is filled.

FIG. 7 is a cross-sectional view schematically illustrating an example of a substrate processing method according to embodiments. Hereinafter, it will be described on the premise that a first reaction gas includes a Si source gas, a second reaction gas includes a nitrogen-containing gas, an etching gas includes a fluorine-containing gas, and an inhibiting gas includes a nitrogen-containing gas. Hereinafter, repeated descriptions of the embodiments will not be given herein.

FIG. 7 (a) shows a first step of forming the thin film 2 on the structure 1 including the gap G. In more detail, the SiN film 2 may be formed by an atomic layer deposition method while alternately and sequentially supplying a silicon-containing precursor as a first reaction gas and a nitrogen-containing gas as a second reaction gas.

FIG. 7 (b) illustrates a second step of etching the SiN film 2 formed on a surface of the gap structure 1 by supplying a fluorine-containing gas (e.g. nitrogen trifluoride ($NF_3$)) as an etching gas. During the etching of a portion of the thin film 2, RF power may be supplied. The fluorine-containing gas is activated and decomposed by RF power in a reaction space, and activated fluorine active species (e.g., fluorine radicals) may etch the SiN thin film 2. At this time, as described above, due to a shielding effect due to a sidewall of the gap structure 1, the SiN thin film 2 in a lower area of the gap structure 1 may have a relatively lower etch rate than that of the SiN thin film 2 in the upper area of the structure 1. Accordingly, the SiN thin film 2 in the upper area of the gap structure 1 is etched more than the SiN thin film 2 in the lower area of the gap structure 1, so that a width of an upper area of the gap G may be greater than a width of the lower area of the gap G. In other words, an upper width of the gap structure 1 may be greater by the second step. This may prevent the upper area of the gap G from being first closed when filling a gap, thereby preventing voids from being formed inside the gap G.

In addition, as shown in FIG. 7 (b), the fluorine active species remaining after etching the SiN thin film are partially adsorbed on a surface of the SiN thin film to form fluorine-terminated sites, or may remain on the surface of the gap structure 1 while forming a weak dangling bond with the surface of the SiN thin film. These fluorine-terminated sites serve as an inhibiting layer during a subsequent gap fill process. As described above, fluorine active species activated under RF power of low frequency (e.g., 430 kHz) and low power (e.g., 300 watt) and low process pressure (e.g., 3 Torr) may reach the bottom surface of the gap G. Accordingly, as can be seen in FIG. 7 (b), the fluorine-terminated sites may be uniformly formed on the lower area and the bottom surface as well as the upper area of the gap structure 1.

FIG. 7 (c) shows a third step of removing the fluorine inhibiting layer (i.e., residual fluorine) on a surface of the SiN thin film 2 of the gap structure 1 by supplying a hydrogen-containing gas as a film formation promoting gas. RF power may be supplied while removing the residual fluorine on the SiN thin film 2. As can be seen in FIG. 7 (c), the residual fluorine (fluorine-terminated sites) may be reduced to hydrogen fluoride gas (HF(g)) by chemically reacting with hydrogen active species (e.g., hydrogen radicals, hydrogen ions, etc.) activated by RF power, and removed. The hydrogen active species may be partially adsorbed on the surface of the SiN thin film 2 while removing the fluorine-terminated sites. Hydrogen adsorbed on the surface of the SiN thin film 2 may serve as hydrogen-terminated sites, which are an active area where the first reaction gas and/or the second reaction gas are adsorbed during a subsequent gap filling step. As described above, in a gap fill process, a thin film is preferably deposited from a lower portion of the gap. Accordingly, it is preferable that the hydrogen active species reach the lower portion of the gap G so that hydrogen-terminated sites are formed up to the bottom surface of the gap G. To this end, at least one of the intensity of a RF power, a RF frequency, a process pressure, and a hydrogen-containing gas supply time may be adjusted. In the present embodiment, a hydrogen-containing gas is activated under high-power RF power and a relatively long hydrogen-containing gas supply time. Accordingly, as shown in FIG. 7 (c), hydrogen-terminated sites may be uniformly formed in the lower area and the bottom surface in addition to the upper area of the gap structure 1.

However, when this third step is carried out, hydrogen-terminated sites are also generated in the upper area of the gap structure 1, which may cause a problem that a thin film is deposited more on the upper area of the gap G during filling a gap.

FIG. 7 (d) shows a fourth step of removing hydrogen-terminated sites adsorbed on the surface of the SiN thin film 2 by supplying nitrogen as an inhibiting gas. RF power may be supplied while removing the hydrogen-terminated sites on the SiN thin film 2. As can be seen in FIG. 7 (d), the hydrogen-terminated sites may be reduced to an ammonia gas (gaseous $NH_3$) by chemically reacting with nitrogen active species activated by RF power, and removed. In particular, nitrogen may reach only the upper area of the gap structure 1 and remove the hydrogen-terminated sites adsorbed on the surface of the SiN thin film 2 therein. To this end, at least one of the intensity of a RF power, a RF frequency, a process pressure, and a nitrogen-containing gas supply time may be adjusted. For example, a nitrogen-containing gas may be activated under conditions of low RF power or a high RF frequency, high process pressure, and a short supply time so that nitrogen active species concentrate in the upper area of the gap G. As can be seen in FIG. 7 (d), relatively more hydrogen-terminated sites may remain in the lower area than in the upper area of the gap structure 1, and nitrogen-terminated sites may be formed in the upper area of the gap structure 1. Due to this configuration, when the gap is filled, the first reaction gas and the second reaction gas may be intensively deposited on the lower portion than an upper portion of the gap.

Figure 8:
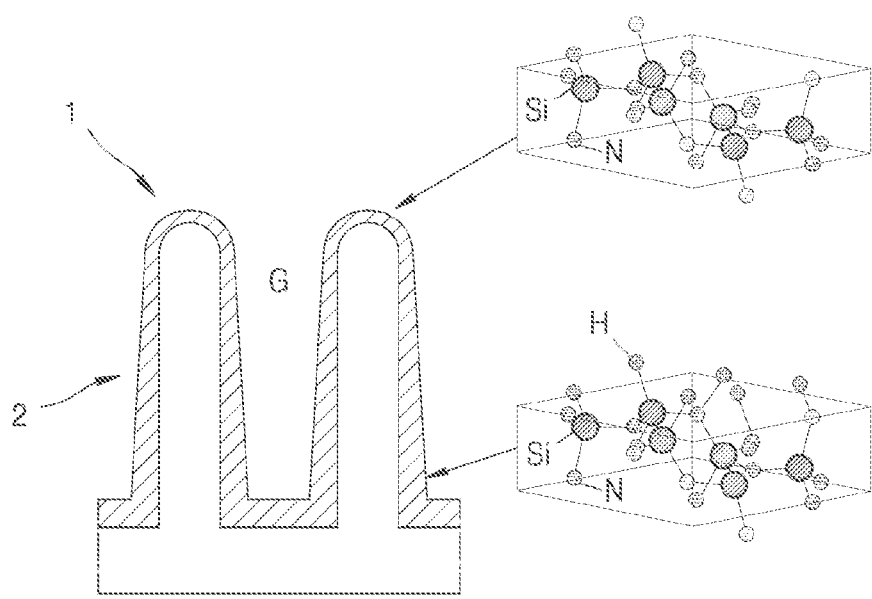
FIG. 8 is a view of thin film components according to a position of a gap structure after a fourth step of FIG. 7.

FIG. 8 shows different shapes of thin film components according to the position of the gap structure 1 after the fourth step of FIG. 7.

FIG. 8 shows that a SiN bonds are formed on the surface of the thin film 2 in the upper portion of the gap structure 1 due to a nitrogen plasma treatment ($N_2$ treatment) effect, and SiNH bonds are formed on the surface of the thin film 2 in the lower portion of the gap structure 1 due to a hydrogen plasma treatment ($H_2$ treatment) effect.

As described above, because a Si source gas reacts with hydrogen-terminated sites on a surface of a lower structure, forms a —Si—N— bond and deposits the same, the hydrogen-terminated sites may promote bonding of Si source molecules. Therefore, during a subsequent gap filling step (fifth step), the deposition rate of a thin film in the upper portion of the gap will be less than the deposition rate of a thin film in the lower portion of the gap, so there is a technical effect that a bottom-up gap fill process may be possible.

Returning to FIG. 7 again, FIG. 7 (e) shows the fifth step of depositing the SiN thin film 2 while filling the gap G. In more detail, the fifth step of depositing an additional thin film may be performed while alternately and sequentially supplying the first reaction gas (in this case, Si source gas) and the second reaction gas (in this case, nitrogen gas) on the SiN thin film 2 on which the first to fourth steps have been performed. At least one of the intensity of RF power, a RF frequency, a process pressure, and a reaction gas supply time may be adjusted such that the first reaction gas and the second reaction gas reach the lower portion of the gap G and form the thin film 2 up to a lower area of the gap G.

In the previous step (the fourth step), by supplying a nitrogen-containing gas as an inhibiting gas, the hydrogen-terminated sites to which the first reaction gas (Si source gas) may be adsorbed are removed from the upper area of the gap G, whereas a relatively large number of hydrogen-terminated sites are preserved in the lower area of the gap G. Accordingly, more Si molecules may be adsorbed to the surface of the SiN thin film 2 in the lower area of the gap G. Thereafter, the SiN thin film 2 may be deposited from the lower area of the gap G while the second reaction gas (nitrogen-containing gas) is supplied. As such, the SiN thin film 2 may be formed through a chemical reaction between the Si source gas and the nitrogen-containing gas while sequentially and alternately supplying the Si source gas and the nitrogen-containing gas. According to an embodiment, the nitrogen-containing gas may be activated by RF power and supplied to form the SiN thin film 2 by plasma atomic layer deposition.

The gap G may be filled by further depositing the SiN thin film 2 while repeating the fifth step. As shown in FIG. 7 (e), during the gap fill process, a width of an inlet of the upper portion of the gap G may be maintained greater than a width of the lower portion of the gap G. When the width of the inlet in the upper portion of the gap G is less than the width of the lower portion of the gap G while filling the gap G, the second to fourth steps are additionally performed to increase the width of the upper portion of the gap G. FIG. 7 (f) shows a sixth step in which the second step to the fifth step are repeatedly performed. As shown in FIG. 7 (f), a group step (i.e., a sixth step) of repeating the second step to the fifth step at least once may be repeated until the gap G is filled. In some embodiments, the second step to the fourth step and the fifth step may be repeated at a certain ratio. For example, a sixth step in which the second step to the fourth step are repeated once and the fifth step is repeated 5 times may be configured and repeated. As another example, a sixth step in which the second step to the fourth step are repeated once and the fifth step is repeated 10 times may be configured, or a sixth step in which the second step to the fourth step are repeated once and the fifth step is repeated 20 times may be configured. Accordingly, widening an upper portion of a gap structure due to partial etching of a thin film, hydrogen treatment, nitrogen treatment, and thin-film formation are repeatedly performed to fill a gap without voids. By widening the upper portion of the gap structure, generating hydrogen-terminated sites in the lower portion of the gap, and generating nitrogen-terminated sites in the upper portion of the gap periodically, there is a technical effect of more effectively preventing a thin film from being deposited more on the upper portion of the gap.

Figure 9:
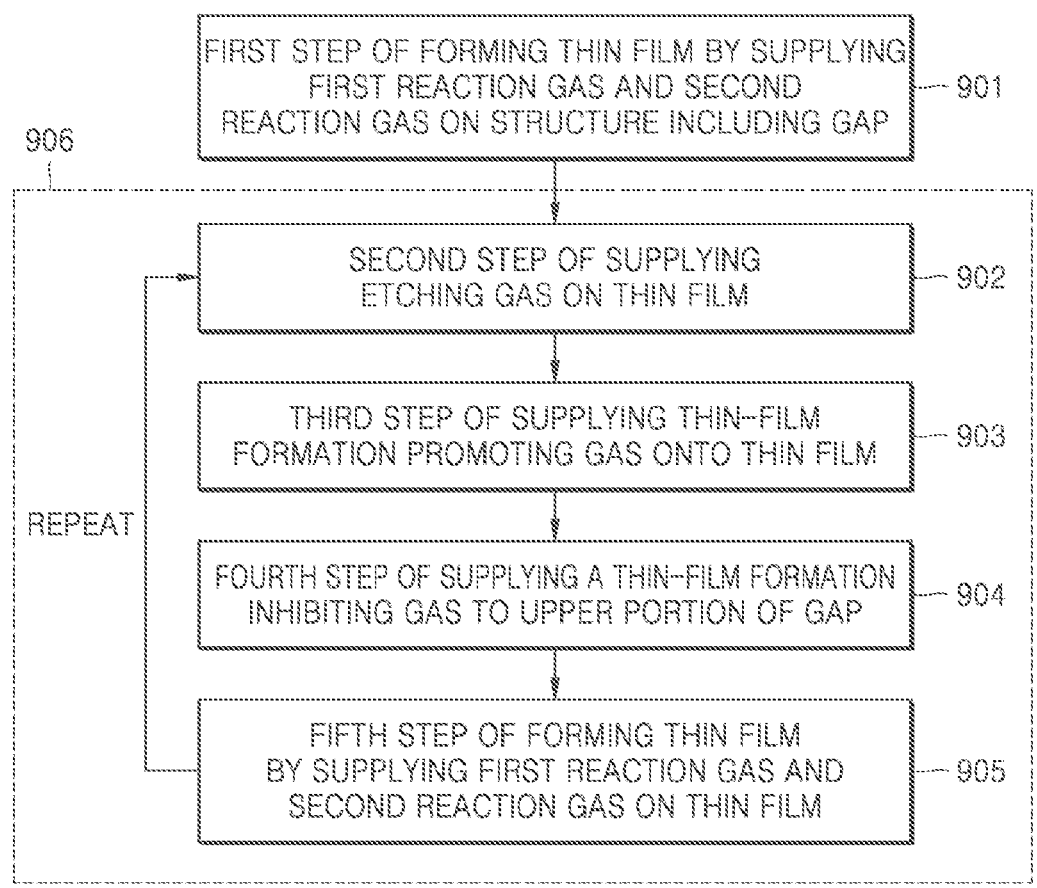
FIG. 9 is a flowchart illustrating a substrate processing method according to embodiments.

FIG. 9 is a flowchart illustrating a substrate processing method according to embodiments. FIG. 10 is a view illustrating a substrate processing method according to embodiments. Referring to FIGS. 9 and 10, a substrate is processed using a first reaction gas, a second reaction gas, an etching gas, a film formation promoting gas, an inhibiting gas, and a purge gas. Hereinafter, it will be described on the premise that the first reaction gas includes a Si precursor, the second reaction gas includes a nitrogen-containing gas, the etching gas includes a fluorine-containing gas, the film formation promoting gas includes a hydrogen-containing gas, the inhibiting gas includes a nitrogen-containing gas and the purge gas includes a nitrogen-containing gas. Hereinafter, repeated descriptions of the embodiments will not be given herein.

First step 901: First, first step of forming a thin film by supplying a first reaction gas and a second reaction gas on a structure including a gap may be performed. In more detail, the first step of forming a thin film on a structure may be performed by performing a first cycle including supplying a first reaction gas (in this case, a Si precursor) on the structure including the gap, supplying a second reaction gas (in this case, $N_2$), supplying RF power, and purging a residue a plurality of times. The first cycle may be repeated one or more times (i.e., a≥1), and a thickness of the first thin film 2 may increase as the first cycle is repeated. In this case, because the first reaction gas is a silicon-containing source gas and the second reaction gas is a nitrogen-containing gas, a silicon nitride layer (SiN) may be formed. At least one of the intensity of RF power, a RF frequency, a process pressure, and a reaction gas supply time may be adjusted such that the first reaction gas and the second reaction gas reach a lower portion of the gap to form a thin film up to the lower area of the gap. For example, the intensity of the RF power may be 700 W, and the RF frequency may be 13.56 MHz.

A Si source gas may be an aminosilane gas composed of nitrogen and an alkyl group ($C_nH_{2n+1}$ or $C_nH_{2n+2}$), such as a diisopropylaminosilane (DIPAS) gas. In this case, the Si source gas adsorbed to the structure including the gap may be Si source molecular fragments in which a bonding structure between constituent elements is destroyed or individual Si, carbon, nitrogen, and hydrogen elements, or a mixture of the corresponding elements. This Si source gas adsorbed to the structure may be a mixture of weak bonds consisting of physical bonding weaker than chemical bonding. The Si source gas may be adsorbed to the gap structure and react with H-terminated sites on a surface of the gap structure to form a —Si—N— chemical bond. The $N_2$ gas is a purge gas as well as the second reaction gas, and reaction by-products may be purged and removed from a reaction space by $N_2$ purge gas.

Second step 902: Second step of supplying an etching gas to the thin film deposited on the structure in the first step may be performed. In more detail, the second step of etching a portion of the thin film may be performed by performing a second cycle including supplying an etching gas (in this case, $NF_3$) on the thin film, supplying RF power, and purging a residue a plurality of times. The second cycle may be repeated one or more times (i.e., b≥1), and the etching amount of the thin film may increase as the second cycle is repeated. As described above, by this step, a width of an inlet at an upper portion of the gap may be greater than a width at a lower portion of the gap.

As described above, in an actual experiment, it is confirmed that $NF_3$ is stably activated at RF power of low frequency (430 kHz) and low power (300 watt) and at low process pressure (3 Torr). That is, the intensity p1 of RF power supplied during the second step is less than the intensity p2 of RF power supplied during the first step and the third step to the fifth step (i.e., p1<p2), and the intensity f1 of RF frequency supplied during the second step may be less than the intensity f2 of RF frequency supplied during the first and third steps to the fifth step (i.e., f1<f2). In the present embodiment, the second step proceeds for 20 seconds under these conditions (i.e., t5=20 s). Because fluorine active species reach the lower area of the gap structure due to low frequency-low power plasma and low process pressure conditions, the fluorine-terminated sites may be uniformly formed in the lower area and the bottom surface in addition to an upper area of the gap structure.

Third step 903: Third step of supplying a film formation promoting gas onto the thin film on which the second step has been performed may be performed. In more detail, the third step of forming a reaction promoting layer that promotes bonding of the first reaction gas or the second reaction gas on the thin film may be performed by performing a third cycle including supplying a film formation promoting gas (in this case, $H_2$ gas) on the thin film, supplying RF power, and purging a residue a plurality of times. The third cycle may be repeated one or more times (i.e., c≥1) to sufficiently remove fluorine-terminated sites on the thin film.

As described above, in an actual experiment, it is confirmed that stable hydrogen plasma is formed when the hydrogen gas ($H_2$) is supplied together with RF power of high frequency (13.56 MHz) and high power (700 watt) and high process pressure (15 Torr). Due to the high frequency and high process pressure, a MFP of the hydrogen active species is shortened, but the supply time of a hydrogen-containing gas is sufficient (in this case, t7=40 seconds) to allow the hydrogen active species to reach the lower portion and the bottom of the gap structure and to remove a fluorine layer formed thereon. That is, in order for the film formation promoting gas ($H_2$ gas) to reach the lower portion of the gap, an RF power supply time t7 of the third cycle may be greater than RF power supply times t3, t5, t9, and t13 of the first cycle, the second cycle, the fourth cycle, and the fifth cycle.

Fourth step 904: Next, fourth step of supplying an inhibiting gas to the upper portion of the gap may be performed. In more detail, the fourth step of forming a passivation layer on a thin film in the upper portion of the gap may be performed by performing a fourth cycle including supplying an inhibiting gas (in this case, $N_2$ gas) on the upper portion of the gap, supplying RF power, and purging a residue a plurality of times. The fourth cycle may be repeated one or more times to form a passivation layer (i.e., d≥1).

When a nitrogen gas, which is an inhibiting gas, is supplied, RF power of high frequency and high power and high process pressure are applied to a reaction space to generate nitrogen radicals. Due to the high frequency and high process pressure conditions, a MFP of the nitrogen radicals is short, so that the arrival area may be confined to the upper area of the gap. Nitrogen gas is supplied for a relatively short time (in this case, t9=2 seconds) because the nitrogen gas may reach the lower area of the gap when the nitrogen gas is supplied for a sufficient time. That is, the RF power supplied in the fourth cycle may be high frequency power and a supply time thereof may be shorter than a supply time of the RF powers supplied in the first cycle to the third cycle, and the fifth cycle (t9<t3, t5, t7, and t13). Accordingly, the inhibiting gas may remove hydrogen termination sites formed on the thin film in the upper portion of the gap.

Fifth step 905: Next, fifth step of forming an additional thin film by supplying the first reaction gas and the second reaction gas on the thin film may be performed. In more detail, the fifth step of forming an additional thin film may be performed by performing a fifth cycle including supplying a first reaction gas on the thin film, supplying a second reaction gas, supplying RF power, and purging a residue a plurality of times. When the fifth step is performed, the gap may be filled while forming an additional thin film on the thin film on which the first to fourth steps have been performed. It is preferable that the thin film on which the first to fourth steps are performed and the additional thin film have the same film quality. The Si source gas reacts with H-terminated sites on a surface of a lower structure to form a —Si—O-chemical bond and deposit the same. Because the H-terminated sites on the thin film in the upper portion of the gap is removed in the fourth step, the Si source gas supplied during the fifth step is deposited from middle and lower portions of the gap. When a nitrogen-containing gas, which is the second reaction gas, is supplied, RF power is applied to the reaction space to form nitrogen radicals, and the nitrogen radicals may reach the middle and lower portions of the gap to form an additional film there.

The fourth cycle may be repeated one or more times to fill the gap in a bottom-up manner (i.e., e≥1).

Sixth step 906: Sixth step of repeatedly performing second step 902 to fifth step 905 may be performed. Sixth step 906 may be repeated several times (f times) until filling the gap G (i.e., f≥1). The second step to the fourth step and the fifth step may be repeated at a certain ratio. For example, a repetition rate (b=c=d:e) of the second to fourth and fifth steps (x times:y times) may be repeated several times (f times) at a ratio of 1:5 or 1:10 or 1:20, and the gap may be filled in a bottom-up manner. By widening the upper portion of the gap structure, generating hydrogen-terminated sites at the lower portion of the gap, and generating nitrogen-terminated sites at the upper portion of the gap periodically in this manner, a phenomenon in which the thin film is deposited more on the upper portion of the gap may be more effectively prevented.

Table 1 below shows an example of experimental conditions under which the above-described embodiment of FIG. 10 is performed.

TABLE 1

| | | First step (Deposition) | Second step (Etching) | Third step ($H_2$ process) | Fourth step (Process) | Fifth step (Deposition) |
|---|---|---|---|---|---|---|
| Gas flow (sccm) | Carrier N2 | 3,000-5,000 | 3,000-5,000 | 3,000-5,000 | 3,000-5,000 | 3,000-5,000 |
| | Reaction gas N2 | 15,000-25,000 | 4,000-6,000 | 15,000-25,000 | 15,000-25,000 | 15,000-25,000 |
| | $NF_3$ | 0 | 50-150 | 0 | 0 | 0 |
| | $H_2$ | 0 | 0 | 1-10 | 0 | 0 |
| Process time (sec) | Si source supply | 0.1-1.0 | 0 | 0 | 0 | 0.1-1.03 |
| | Si source purge | 0.1-2.0 | 0 | 0 | 0 | 0 |
| | Reaction gas N2 | 1-8 | 0 | 0 | 1-6 | 1-10 |
| | $NF_3$ (plasma on) | 0 | 10-30 | 0 | 0 | 0 |

TABLE 1-continued

|  |  | First step (Deposition) | Second step Etching) | Third step (H$_2$ process) | Fourth step Process) | Fifth step Deposition) |
|---|---|---|---|---|---|---|
|  | NF$_3$ purge | 0 | 10-40 | 0 | 0 | 0 |
|  | H$_2$ (plasma on) | 0 | 0 | 10-60 | 0 | 0 |
|  | H$_2$ purge | 0 | 0 | 10-50 | 0 | 0 |
| RF power (W) | 13.56 MHz | 500 watt to 1,000 watt | 0 | 500 watt to 1,000 watt | 500 watt to 1,000 watt | 500 watt to 1,000 watt |
|  | 430 KHz | 0 | 100 watt to 400 watt | 0 | 0 | 0 |
| Pressure (Torr) |  | 10-20 | 1-5 | 10-20 | 10-20 | 10-20 |
| Temperature (° C.) |  | 300-600 | 300-600 | 300-600 | 300-600 | 300-600 |

In Table 1, at least one of silane, aminosilane, and iodosilane may be used as the Si source. For example, at least one of a TSA-based mixture such as TSA, (SiH$_3$)$_3$N; DSO, (SiH$_3$)$_2$; DSMA, (SiH$_3$)$_2$NMe; DSEA, (SiH$_3$)$_2$NEt; DSIPA, (SiH$_3$)$_2$N(iPr); DSTBA, (SiH$_3$)$_2$N(tBu); DEAS, SiH$_3$NEt$_2$; DTBAS, SiH$_3$N(tBu)$_2$; BDEAS, SiH$_2$(NEt$_2$)$_2$; BDMAS, SiH$_2$(NMe$_2$)$_2$; BTBAS, SiH$_2$(NHtBu)$_2$; BITS, SiH$_2$(NHSiMe$_3$)$_2$; DIPAS; SiH$_3$N(iPr)$_2$; TEOS, Si(OEt)$_4$; SiCl$_4$; HCD, Si$_2$Cl$_6$; 3DMAS, SiH(N(Me)$_2$)$_3$; BEMAS, Si H$_2$[N(Et)(Me)]$_2$; AHEAD, Sit (NHEt)$_6$; TEAS, Si(NHEt)$_4$; Si$_3$H$_8$; DCS, SiH$_2$Cl$_2$; SiHI$_3$; SiH$_2$I$_2$; TSA (trisilyamine), and trimer-trisilyamine, or a derivative and a group thereof, or a mixture thereof may be used. A nitrogen-containing gas as the reaction gas may be at least one of N$_2$, NH$_3$, N$_2$O, or NO$_2$, or a mixture of one or more thereof.

In the above embodiments, the silicon nitride film is presented as an embodiment, but the disclosure is not limited thereto. For example, when oxygen-containing gas is supplied instead of nitrogen-containing gas in the step of supplying the second reaction gas, a silicon oxide film may be formed, and then, a silicon oxide film gap fill process without voids may be performed by treating with hydrogen and nitrogen.

In addition, it should be noted that the disclosure is not limited to the above embodiments. For example, although the above embodiment is performed at a high temperature of 500 degrees or more, it is not limited thereto and may be implemented in a low temperature or other temperature range.

Figure 11A:
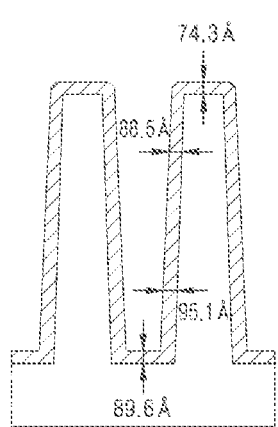
FIGS. 11A-11C are views respectively illustrating a result of a gap fill process by the conventional deposition-etch-deposition (DED) method, a result of a gap fill process by the conventional deposition-etch-$H_2$ plasma treatment-deposition (DEHD) method, and a result of a gap fill process by a deposition-etch-$H_2$ plasma treatment-$N_2$ plasma treatment-deposition (DEHND) method according to an embodiment.

FIGS. 11A, B, and C are views respectively illustrating a result of a gap fill process by the conventional deposition-etch-deposition (DED) method, a result of a gap fill process by the conventional deposition-etch-H$_2$ plasma treatment-deposition (DEHD) method, and a result of a gap fill process by a deposition-etch-H$_2$ plasma treatment-nitrogen plasma treatment-deposition (DEHND) method according to an embodiment.

Figure 11B:
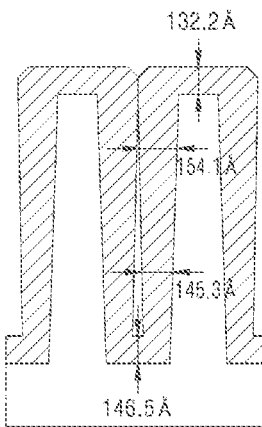
Figure 11C:
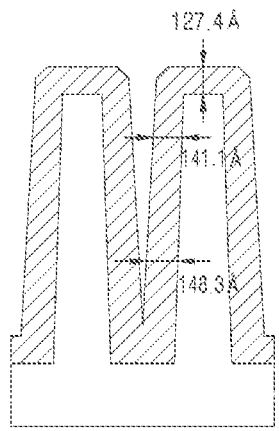

FIG. 11 (a) shows a state in which a gap is filled by the DED method in which a SiN thin film is deposited on a gap structure (the first step in FIG. 10), etching is performed using a NF$_3$ gas (the second step in FIG. 10), and deposition is repeated again (the fifth step in FIG. 10). Because etching is performed using a NF$_3$ gas, a width of an upper area of a gap is widened, whereas a fluorine element adsorbed on a surface of a thin film suppresses the deposition of the SiN thin film, so the film growth rate is low. From FIG. 11A, it can be seen that the thickness of a thin film (74.3 Å to 96.1 Å) is significantly less than thin film thicknesses of a DEHD process result (FIG. 11B) and a DEHND process result (FIG. 11C). As such, because a deposition process is performed immediately after an etching process in the case of the DED method, a fluorine component may remain on a surface of a thin film and the growth rate of a film may be reduced during a subsequent deposition process after the etching process, thereby reducing productivity per hour.

FIG. 11B shows a state in which a gap is filled by a DEHD method repeating depositing a SiN thin film on a gap structure (the first step in FIG. 10), performing etching using a NF$_3$ gas (the second step in FIG. 10), performing hydrogen plasma treatment (the third step in FIG. 10) and deposition (the fifth step in FIG. 10). As described with reference to FIG. 7, a hydrogen element may remove fluorine-terminated sites adsorbed on a thin film surface and adsorb on the thin film surface to form hydrogen-terminated sites, and the hydrogen-terminated sites may serve as a bonding site for a Si element. Therefore, there is a technical effect that the growth rate of a thin film is greater than in the method of FIG. 11A (i.e., the DED method). As can be seen in FIG. 11B, a thickness (132.2 Å to 154.1 Å) of the thin film formed by the DEHD process may be greater than the thin film thickness of the DED process result (FIG. 11A). However, due to the rapid growth of a thin film, the upper portion of the gap structure is closed first, and accordingly, a void is formed in the lower portion of the gap structure.

FIG. 11C shows a state in which a gap is filled by a DEHND method repeating depositing a SiN thin film on a gap structure (the first step in FIG. 10), performing etching using a NF$_3$ gas (the second step in FIG. 10), performing hydrogen plasma treatment (the third step in FIG. 10), performing nitrogen plasma treatment (the fourth step in FIG. 10), and deposition (the fifth step in FIG. 10). As described above, hydrogen-terminated sites may be formed at the same time as fluorine-terminated sites adsorbed to a thin film surface is removed using hydrogen plasma, and then nitrogen-terminated sites may be formed in an upper area of a gap structure using nitrogen plasma. The nitrogen-terminated sites may serve as an inhibiting layer that inhibits adsorption of Si source molecules. On the other hand, hydrogen-terminated sites still remain in a lower area of the gap structure to promote adsorption of Si source molecules, and thus the deposition rate may be greater than in an upper area of the gap structure. That is, by performing the nitrogen plasma treatment, there is a technical effect of selectively controlling the excessive growth rate of a thin film according to hydrogen treatment, depending on the position in the gap structure. In this case, because the deposition rate of a thin film in the upper area of the gap structure is less than the deposition rate of a thin film in the lower area of the gap structure, there is a technical effect that voids are not formed and the gap is filled. Actually, comparing B and C of FIG. 11, it can be seen that a thickness of the thin film in the upper area of the gap structure is greater in B than in C of FIG. 11, and a thickness of the thin film in the lower area of the gap structure is greater in C than in B of FIG. 11. In addition, by hydrogen plasma treatment, there is an additional technical effect of improving the productivity per hour by removing fluorine impurities in the thin film and at the same time improving a gap filling rate.

FIG. 12 is a view illustrating secondary ion mass spectrometry (SIMS) analysis results showing components inside a thin film during the DED process of FIG. 11A and the DEHD process of FIG. 11B.

Figure 12A:
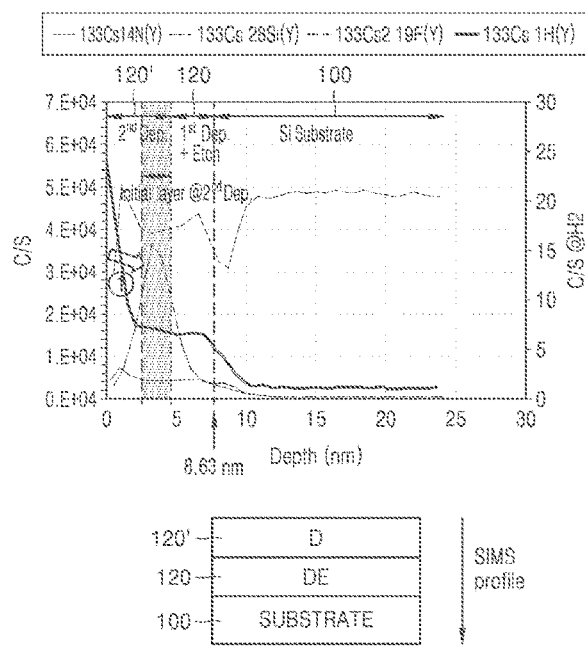
FIGS. 12A and 12B is a view illustrating a secondary ion mass spectrometry (SIMS) analysis result showing components inside a thin film during the DED process of FIG. 11A and the DEHD process of FIG. 11B.

The lower view of FIG. 12A shows a structure produced by the DED process, and the upper graph shows an SIMS analysis result of a structure produced by the DED process. In more detail, the lower view of FIG. 12A shows a thin film ($1^{st}$ deposition+etch film) 120 that has been deposited and etched on the substrate 100 and a thin film ($2^{nd}$ deposition film) 120' deposited on the thin film 120.

Figure 12B:
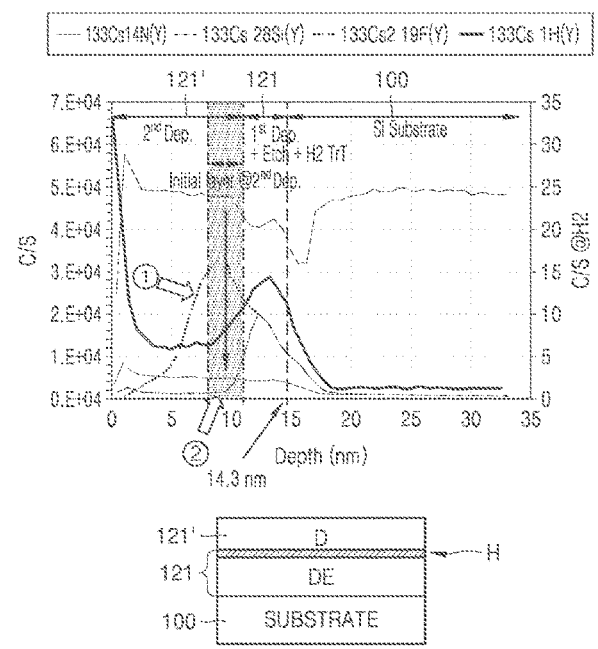

The lower view of FIG. 12B shows a structure produced by the DEHD process, and the upper graph shows an SIMS analysis result of a structure produced by the DEHD process. In more detail, the lower view of FIG. 12B shows a thin film ($1^{st}$ deposition+etch+$H_2$ treatment film) 121 that has been deposited, etched, and hydrogen-treated on the substrate 100 and a thin film ($2^{nd}$ deposition film) 121' deposited on the thin film 121.

Comparing the graphs of FIGS. 12A and B, it can be seen that a fluorine component is on a surface of the thin film ($1^{st}$ deposition+etch film) that has been deposited and etched during the DED process of FIG. 12A (e.g., the thin film 2 in FIG. 3 and the thin film 120 in FIG. 12) (arrow ①), but as shown in FIG. 12B, when hydrogen treatment is performed during the DEHD process after the deposition and etching processes, a fluorine component on a surface of the thin film ($1^{st}$ deposition film+etch+$H_2$ treatment film) (e.g., the thin film 2 of FIG. 4 and the thin film 121 of FIG. 12) is greatly reduced (arrow ②). A dotted curve indicated by arrow ① in FIG. 12B is a hypothetical distribution curve added for understanding and comparison, indicating the distribution of fluorine components remaining on the surface of the thin film when no hydrogen treatment is performed, and corresponds to a curve indicated by arrow ① in FIG. 12A.

Because the process of FIG. 12 is performed at a high temperature of 500 degrees or more, a fluorine component due to diffusion may remain inside the thin film 120 or 121. However, it is confirmed that the fluorine component on the surface of the thin film 120 or 121 may be removed by hydrogen treatment.

It is to be understood that the shape of each portion of the accompanying drawings is illustrative for a clear understanding of the disclosure. It should be noted that the portions may be modified into various shapes other than the shapes shown. In the drawings, the same reference numerals refer to the same elements.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:
   a first step of forming a thin film on a structure including a gap by performing a first cycle including supplying a first reaction gas and supplying a second reaction gas on the structure a plurality of times;
   a second step of etching a portion of the thin film by supplying a fluorine-containing gas onto the thin film;
   a third step of supplying a hydrogen-containing gas onto the thin film;
   a fourth step of supplying an inhibiting gas to an upper portion of the gap; and
   a fifth step of forming a thin film by performing a second cycle including supplying the first reaction gas and supplying the second reaction gas on the thin film a plurality of times,
   wherein a supply time of the inhibiting gas is less than a supply time of the first reaction gas, the second reaction gas, the fluorine-containing gas, and the hydrogen-containing gas.

2. The substrate processing method of claim 1, wherein, during the second step, an etch rate of a thin film in the upper portion of the gap is greater than an etch rate of a thin film in a lower portion of the gap.

3. The substrate processing method of claim 1, wherein the hydrogen-containing gas supplied during the third step removes fluorine-terminated sites formed on a surface of the thin film during the second step.

4. The substrate processing method of claim 3, wherein the hydrogen-containing gas supplied during the third step reaches a lower portion of the gap.

5. The substrate processing method of claim 1, wherein the inhibiting gas supplied during the fourth step removes hydrogen-terminated sites on a thin film that bonds to the first reaction gas or the second reaction gas.

6. The substrate processing method of claim 5, wherein the inhibiting gas supplied during the fourth step removes the hydrogen-terminated sites on the thin film in the upper portion of the gap, thereby suppressing the formation of a thin film in the upper portion of the gap during the fifth step.

7. The substrate processing method of claim 6, wherein the inhibiting gas includes a nitrogen-containing gas, and, after the fourth step, nitrogen-terminated sites are formed on the thin film in the upper portion of the gap and hydrogen-terminated sites remain on a thin film in a lower portion of the gap.

8. The substrate processing method of claim 7, wherein the second step, the third step, the fourth step, and the fifth step are repeatedly performed until the gap is filled.

9. The substrate processing method of claim 8, wherein, during the filling of the gap, a width of an inlet at the upper portion of the gap is maintained to be greater than a width of the gap at the lower portion of the gap.

10. The substrate processing method of claim 1, wherein RF power is supplied during the first step, the second step, the third step, the fourth step, and the fifth step.

11. A substrate processing method comprising:
    a first step of forming a thin film on a structure including a gap by performing a first cycle including supplying a first reaction gas and supplying a second reaction gas on the structure a plurality of times;
    a second step of etching a portion of the thin film by supplying a fluorine-containing gas onto the thin film;
    a third step of supplying a hydrogen-containing gas onto the thin film;
    a fourth step of supplying an inhibiting gas to an upper portion of the gap; and a fifth step of forming a thin film by performing a second cycle including supplying the first reaction gas and supplying the second reaction gas on the thin film a plurality of times, wherein RF power is supplied during the first step, the second step, the third step, the fourth step, and the fifth step, and an intensity of the RF power supplied during the second step is less than an intensity of the RF power supplied during the first step, the third step, and the fourth step.

12. A substrate processing method comprising:
a first step of forming a thin film on a structure including a gap by performing a first cycle including supplying a first reaction gas and supplying a second reaction gas on the structure a plurality of times;
a second step of etching a portion of the thin film by supplying a fluorine-containing gas onto the thin film;
a third step of supplying a hydrogen-containing gas onto the thin film;
a fourth step of supplying an inhibiting gas to an upper portion of the gap; and
a fifth step of forming a thin film by performing a second cycle including supplying the first reaction gas and supplying the second reaction gas on the thin film a plurality of times, wherein
RF power is supplied during the first step, the second step, the third step, the fourth step, and the fifth step, and
a RF frequency supplied during the second step is less than a RF frequency supplied during the first step, the third step, and the fourth step.

13. A substrate processing method comprising:
a first step of forming a thin film on a structure including a gap by performing a first cycle including supplying a first reaction gas on the structure, supplying a second reaction gas, supplying RF power, and purging a residue a plurality of times;
a second step of etching a portion of the thin film by performing a second cycle including supplying an etching gas on the thin film, supplying RF power, and purging a residue a plurality of times;
a third step of forming a reaction promoting layer on the thin film to promote bonding of the first reaction gas or the second reaction gas by performing a third cycle including supplying a film formation promoting gas to the thin film, supplying RF power, and purging a residue a plurality of times;
a fourth step of forming a passivation layer on a thin film in an upper portion of the gap by performing a fourth cycle including supplying an inhibiting gas to the upper portion of the gap, supplying RF power, and purging a residue a plurality of times; and
a fifth step of forming an additional thin film by performing a fifth cycle including supplying a first reaction gas onto the thin film, supplying a second reaction gas, supplying RF power, and purging a residue a plurality of times.

14. The substrate processing method of claim 13, wherein the RF power supplied in the third cycle is supplied for longer time than a supply time of the RF power supplied in the first cycle, the second cycle, the fourth cycle, and the fifth cycle, so that the film formation promoting gas reaches a lower portion of the gap.

15. The substrate processing method of claim 13, wherein a supply time of the RF power supplied in the fourth cycle is shorter than a supply time of the RF power supplied in the first cycle to the third cycle, and the fifth cycle.

16. A substrate processing method comprising:
a first step of forming a thin film on a structure including a gap;
a second step of supplying a fluorine-containing gas onto the thin film to etch a portion of the thin film, wherein an etch rate of a thin film in an upper portion of the gap is greater than an etch rate of a thin film in a lower portion of the gap;
a third step of supplying a hydrogen-containing gas onto the thin film to remove fluorine-terminated sites formed on a surface of the thin film during the second step;
a fourth step of supplying a nitrogen-containing gas onto the thin film to remove a portion of the hydrogen-terminated sites formed on the surface of the thin film during the third step; and
a fifth step of depositing an additional thin film on the thin film on which the second to fourth steps have been performed.

17. The substrate processing method of claim 16, wherein the hydrogen-containing gas supplied during the third step reaches the lower portion of the gap to form hydrogen-terminated sites on a surface of the thin film in the lower portion of the gap, and
the hydrogen-terminated sites formed on the surface of the thin film in the lower portion of the gap serves as a reaction promoting layer that promotes bonding of a reaction gas supplied during the fifth step.

18. The substrate processing method of claim 16, wherein the fourth step comprises:
supplying a nitrogen-containing gas onto the upper portion of the gap to remove hydrogen-terminated sites formed on a surface of a thin film in the upper portion of the gap.

19. The substrate processing method of claim 18, wherein
the nitrogen-containing gas supplied during the fourth step forms nitrogen-terminated sites on the surface of the thin film in the upper portion of the gap, and
the nitrogen-terminated sites formed on the surface of the thin film in the upper portion of the gap may serve as an inhibiting layer that inhibits bonding of the reaction gas supplied during the fifth step.

20. The substrate processing method of claim 18, wherein, during the fifth step, a thin film deposition rate at the upper portion of the gap is less than a thin film deposition rate at the lower portion of the gap.

* * * * *